United States Patent
LePort et al.

(10) Patent No.: US 9,529,048 B2
(45) Date of Patent: Dec. 27, 2016

(54) TRANSIENT DETECTION OF AN EXCEPTIONAL CHARGE EVENT IN A SERIES CONNECTED BATTERY ELEMENT

(71) Applicants: Francisco LePort, San Francisco, CA (US); Scott Ira Kohn, Redwood City, CA (US)

(72) Inventors: Francisco LePort, San Francisco, CA (US); Scott Ira Kohn, Redwood City, CA (US)

(73) Assignee: TESLA MOTORS, INC., Palo Alto, CA (US)

( * ) Notice: Subject to any disclaimer, the term of this patent is extended or adjusted under 35 U.S.C. 154(b) by 826 days.

(21) Appl. No.: 13/689,787

(22) Filed: Nov. 30, 2012

(65) Prior Publication Data

US 2014/0152315 A1 Jun. 5, 2014

(51) Int. Cl.
*H01M 10/44* (2006.01)
*H01M 10/46* (2006.01)
*G01R 31/36* (2006.01)

(52) U.S. Cl.
CPC ....... *G01R 31/3606* (2013.01); *G01R 31/3648* (2013.01)

(58) Field of Classification Search
CPC .................................................. H02J 7/0026
USPC ........................................................ 320/134
See application file for complete search history.

(56) References Cited

U.S. PATENT DOCUMENTS

| 8,860,423 B2* | 10/2014 | Miyamoto | 324/433 |
| 2008/0164849 A1* | 7/2008 | Ciaramitaro | H01M 10/345 320/151 |
| 2011/0068746 A1 | 3/2011 | Rocci et al. | |
| 2013/0141109 A1* | 6/2013 | Love et al. | 324/430 |
| 2013/0307487 A1* | 11/2013 | Matthe et al. | 320/152 |

FOREIGN PATENT DOCUMENTS

| KR | 20130121143 | 5/2013 |
| KR | 20130124413 | 11/2013 |

OTHER PUBLICATIONS

International Application No. PCT/US2013/072082, International Search Report dated Apr. 14, 2014, 3 pages.
International preliminary report on patentability in application PCT/US2013/072082 dated Jun. 2, 2015, 10 pages.

* cited by examiner

*Primary Examiner* — Edward Tso
*Assistant Examiner* — Ahmed Omar
(74) *Attorney, Agent, or Firm* — Garlick & Markison; Bruce E. Garlick

(57) ABSTRACT

A system and method for identifying and responding to exceptional charge events of series-connected energy storage elements.

23 Claims, 8 Drawing Sheets

TRANSIENT DETECTION OF AN EXCEPTIONAL CHARGE EVENT IN A SERIES CONNECTED BATTERY ELEMENT

FIELD OF THE INVENTION

The present invention relates generally to chargeable battery packs, and more specifically, but not exclusively, to detection and remediation of an exceptional charge state of a series element of a chargeable battery packs.

BACKGROUND OF THE INVENTION

The subject matter discussed in the background section should not be assumed to be prior art merely as a result of its mention in the background section. Similarly, a problem mentioned in the background section or associated with the subject matter of the background section should not be assumed to have been previously recognized in the prior art. The subject matter in the background section merely represents different approaches, which in and of themselves may also be inventions.

Battery packs, for purposes of this disclosure, are series-connected battery elements. These elements may, in turn, include a parallel, series, or combination of both, collection of chargeable energy storage cells, usually rechargeable cells. Collectively all these cells store energy for the battery pack. The series-connected battery elements may, in turn be subdivided into collections of modules, each module including one or more series-connected battery element.

In many instances, the battery pack may be treated as a monolithic unit, providing energy for operation. However, to enable such treatment, individual cells, series-elements, and modules are processed in order to achieve a desired average monolithic effect. One particular concern is that at the individual level, the series elements are not the same and store differing amounts of energy and charge/discharge at different rates. These variations are natural and expected. In certain situations, the variations can lead to an exceptional variation, defined herein as an exceptional charge state, in which an individual series element is excessively overcharged or overdischarged (as compared to some threshold).

Overcharge of a lithium-ion battery can lead to thermal runaway, either directly or via increased susceptibility to abuse due to decreased chemical stability. When charging a battery pack which includes more than one series element, an initial imbalance in the state of charge of the series elements can result in overcharge of one or more of the series elements, even when the voltage of the battery pack does not indicate overcharge. There are conventional solutions to mitigate this potential hazard that monitor series element voltages and are in place to ensure balance prior to charging. However, due to the potential severity of exceptional charge events, particularly for overcharge events, additional systems for identifying series element overcharge in a battery pack before the event becomes severe are desired in the event that the voltage monitoring and balancing system malfunctions or may otherwise insufficiently address the exceptional charge event.

What is needed is a system and method for identifying exceptional charge events of series-connected energy storage elements, and responding appropriately to detected exceptional charge events.

BRIEF SUMMARY OF THE INVENTION

Disclosed is a system and method for identifying and responding to exceptional charge events of series-connected energy storage elements. The following summary of the invention is provided to facilitate an understanding of some of technical features related to detecting to exceptional charge events of series-connected elements and responses thereto, and is not intended to be a full description of the present invention. A full appreciation of the various aspects of the invention can be gained by taking the entire specification, claims, drawings, and abstract as a whole. The present invention is applicable to other implementations in addition to electric vehicles such as stored energy cases providing energy time shifting of renewable energy generation (e.g., solar and wind generators), to other arrangements of series-connected energy storage elements, and may be applied to other cell chemistries.

An exceptional charge event detector for an energy storage system having a plurality of series-connected battery elements, including a data acquisition system, coupled to the plurality of series-connected battery elements and determining, for each battery element of the plurality of series-connected battery elements, an associated charge dependent parameter during an operational period of the energy storage system; a controller, coupled to the data acquisition system, establishing a characterization for each battery element of the plurality of series-connected battery elements from the associated charge dependent parameters; wherein the characterization includes one of an exceptional characteristic pattern for the operational period or a normal characteristic pattern for the operational period; and wherein the controller detects an exceptional charge event for a selected one battery element whenever the characterization for the selected one battery element includes an associated exceptional characteristic pattern during the operational period.

A rechargeable energy storage system having a plurality of series-connected lithium-ion battery elements, including a voltage measurement and balancing system detecting and reducing voltage imbalances between voltage levels of the plurality of battery elements of the energy storage system wherein the voltage measurement and balancing system uses a first detection modality to determine an existence of a voltage imbalance; and an exceptional charge event detector monitoring the plurality of battery elements for an exceptional charge event using a second detection modality different from the first detection modality.

A computer-implemented method for detecting an exceptional charge event for an energy storage system having a plurality of series-connected battery elements, including a) determining, for each battery element of the plurality of series-connected battery elements, an associated charge dependent parameter during an operational period of the energy storage system; b) establishing a characterization for each battery element of the plurality of series-connected battery elements from the associated charge dependent parameters; wherein the characterization includes one of an exceptional characteristic pattern for the operational period or a normal characteristic pattern for the operational period; and c) detecting an exceptional charge event for a selected one battery element whenever the characterization for the selected one battery element includes an associated exceptional characteristic pattern during the operational period.

Any of the embodiments described herein may be used alone or together with one another in any combination. Inventions encompassed within this specification may also include embodiments that are only partially mentioned or alluded to or are not mentioned or alluded to at all in this brief summary or in the abstract. Although various embodiments of the invention may have been motivated by various deficiencies with the prior art, which may be discussed or alluded to in one or more places in the specification, the embodiments of the invention do not necessarily address any of these deficiencies. In other words, different embodiments of the invention may address different deficiencies that may be discussed in the specification. Some embodiments may only partially address some deficiencies or just one deficiency that may be discussed in the specification, and some embodiments may not address any of these deficiencies.

Other features, benefits, and advantages of the present invention will be apparent upon a review of the present disclosure, including the specification, drawings, and claims.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION OF THE INVENTION

Figure 1:
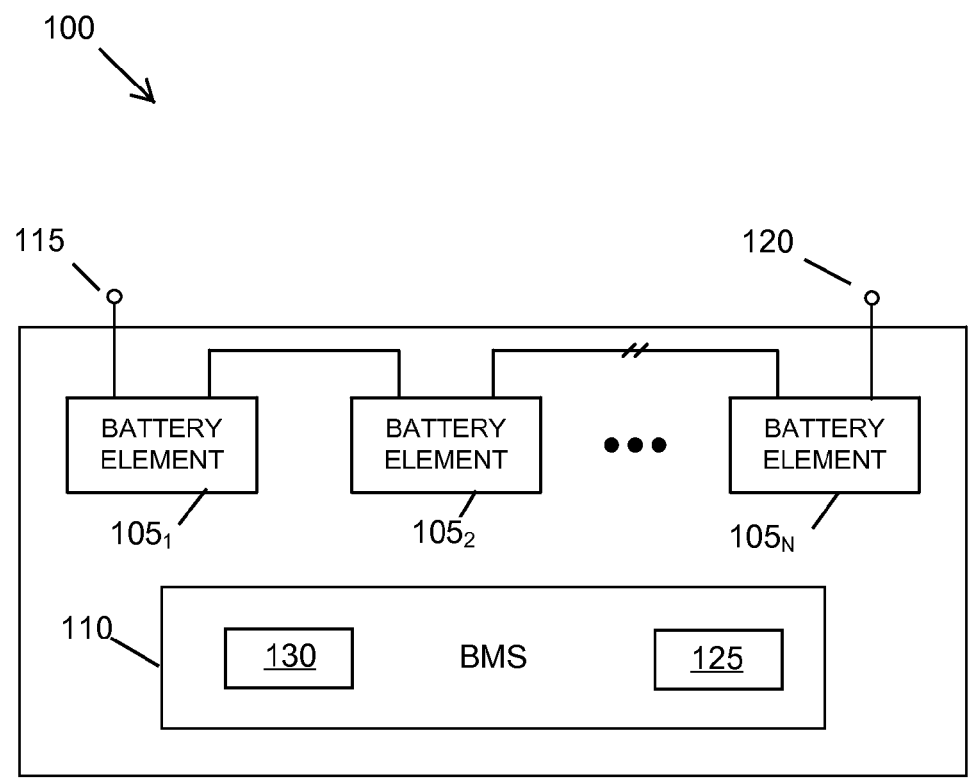
FIG. 1 illustrates an energy storage system.

Embodiments of the present invention provide a system and method for identifying exceptional charge events of series-connected energy storage elements. The following description is presented to enable one of ordinary skill in the art to make and use the invention and is provided in the context of a patent application and its requirements.

Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

It is important that a rechargeable energy storage system having multiple series-connected energy storage elements, particularly for those storing high energy levels and/or charging at high energy transfer rates, to detect exceptional charge events, more particularly in identified individual series elements. The following disclosure includes detection of exceptional charge events and possible responses to detected exceptional charge events. The detection addresses detection in two different types of cases: a "steady state" case and a "transient" case. Steady state is characterized as those scenarios where energy change events tend to be predictable, consistent, longer time scales (several minutes, to hours, to longer periods), and relatively lower energy and "transient" cases tend to be on an opposite side of this spectrum: unpredictable, variable, shorter time scales (~1 second to several minutes), and relatively higher energy. There are not bright lines categorizing these cases. There are two representative uses that highlight these cases: 1) an electric vehicle (EV) case and 2) a stationary storage case. In the EV case, external charging is representative of the steady state case. In the stationary storage case, withdrawal or external grid charging of stored energy is representative of the steady state case. For the EV, internal regenerative events are representative of the transient case, as well as energy use that responds to the user's driving pattern and traffic/road conditions. For the stationary storage case, charging from a wind or solar generator is representative of the transient case.

Whether categorized as transient or steady state operation, during charging a system advantageously monitors for and is able to detect an exceptional charge event as an overcharge event. In contrast, during discharge the system monitors for and is able to detect any exceptional charge event as an overdischarge event. Different information and methods are used for the detection based upon which type of case. Broadly speaking, detection takes advantage of anything that affects loaded voltage vs. SOC. The system and methods of the preferred embodiments detect differences between an actual SOC and a measured SOC as energy storage in one or more battery cells changes (e.g., during charging and discharging). The preferred embodiments are able to take advantage of anything measurably different between battery cells that arise because of SOC differences.

Responding to a detected exceptional charge event does not depend upon the use, but on the nature of the exceptional charge event. That is, an appropriate response will depend upon whether the detected exceptional charge event is an overcharge event or an overdischarge event.

For purposes of this application, "transient" means a period of about one second, a few minutes, or a shorter period. For purposes of this application, "steady state" means a period of several minutes, several hours, or longer period.

This application is one of four related applications that address various aspects of the detection and response to exceptional charge events. In addition to this application, those other three applications are: U.S. patent application Ser. No. 13/690,105 entitled "STEADY STATE DETECTION OF AN EXCEPTIONAL CHARGE EVENT IN A SERIES CONNECTED BATTERY ELEMENT" and filed concurrently herewith, U.S. patent application Ser. No. 13/690,203 entitled "RESPONSE TO DETECTION OF AN OVERCHARGE EVENT IN A SERIES CONNECTED BATTERY ELEMENT" and filed concurrently herewith, and U.S. patent application Ser. No. 13/690,341 entitled "RESPONSE TO DETECTION OF AN OVERDISCHARGE EVENT IN A SERIES CONNECTED BATTERY ELEMENT" and filed concurrently herewith. All these applications are hereby expressly incorporated by reference thereto in their entireties for all purposes.

FIG. 1 illustrates an energy storage system 100 (ESS). ESS 100 includes a set of battery elements 105$i$, i=1 to N where N can be tens, to hundreds, to thousands of series-coupled elements. A battery element 105$x$ in the present context includes individual battery cells, but also includes aggregations of parallel and/or series connected elements that are, in turn, connected in series with another battery element (e.g., battery elements 105$x$−1 and 105$x$+1). The embodiment disclosed herein is focused primarily on battery elements 105 with lithium-ion chemistry but may be adapted to work with other cell chemistries.

A battery management system (BMS) 110 is electrically communicated to the components of ESS 100 for monitoring, data acquisition, and control. As such it includes sensors and control elements (e.g., combinatorial and arithmetic logic elements and in some cases stored-program processing units executing instructions from a memory and the like) that perform the functions and processes described herein.

Individual cells are packaged and there may be additional packaging of collections of the battery cells of each particular battery element 105i. Individual cells may be combined in desired parallel and series arrangements and packaged together into modules that may be further electrically connected together. There are logical sets of elements (e.g., battery element 105) that each include a positive terminal and a negative terminal reflecting a relative voltage level. In general for the series-connected battery element, a positive terminal of a particular battery element 105i is electrically communicated to a negative terminal of an "upstream" battery element 105i−1. A negative terminal of battery element 105i is electrically communicated to a "downstream" battery element 105i+1. This is done for i=1 to N number of battery elements, with the positive terminal of battery element 1051 coupled to an ESS positive terminal 115 and the negative terminal of battery element 105N coupled to an ESS negative terminal 120.

A relative terminal voltage between ESS positive terminal 115 and ESS negative terminal 120 provides the collective net contributions of the N number of battery elements 105N. ESS 100 is charged and discharged through these terminals. ESS 100 stores energy for many different applications, including energy for an electric propulsion motor of an electric vehicle (EV) and energy storage supporting time-shifted energy production from wind and solar generators and the like. While the terminal voltage presents a statistical effect of the aggregated series-connected battery elements 105, the voltages of the individual battery elements 105i vary between each other. There are two different types of variations that are specifically mentioned here, though other variations may also come into play, sometimes with lesser or greater contribution. An individual battery element 105i will have a voltage offset variation and a voltage gain measurement error. (Note that this is a measurement error, not an actual variation in the voltage of the battery element. The voltage of the battery element will include natural variations, but this is due to normal charge/discharge cycling of the element. The same charge/discharge cycle may not change SOC of two battery elements identically.) BMS 110 includes a voltage measurement and balancing system (VMBS) 125 that acquires individual voltage measurements, including the individual voltages of battery elements 105.

It is the case that a voltage of ESS 100 could indicate a charge level within design specification while an actual voltage level of a battery element 105x could be different than other elements. When the difference is excessive, the different voltage levels of the battery elements produce a potentially dangerous charge imbalance. Without VMBS 125, the charge imbalance could produce a potential hazard of overcharging some battery elements 105 because a charger for ESS 100 would see the terminal voltages as being within specification. Also, without VMBS 125, the charge imbalance could produce a potential hazard of overdischarging some battery elements 105 during energy withdrawal from ESS 100 which would be based on the "average" charge and any undercharged cells could have too much energy withdrawn.

VMBS 125 mitigates this potential hazard by monitoring the individual voltages of battery elements 105 and ensures balance and/or non-hazardous charging prior to charging of ESS 100. As noted above, due to potential severity of overcharge events, BMS 110 includes further structures and processes for identification of series element exceptional charge events in ESS 100 before such event(s) become severe. This can be considered a backup to VMBS 125 in case VMBS malfunctions or otherwise does not detect a particular condition of battery elements 105 that could lead to dangerous imbalance.

VMBS 125 can malfunction in different ways, one of which is that it can experience a measurement error. Without such a measurement error, VMBS 125 could respond to an imbalance by asserting a status signal to BMS 110 that results in some type of response. That response could include inhibition of an initiation of charging of ESS 100, or termination of charging after it has begun. VMBS 125 with a measurement error could contribute to a dangerous imbalance by allowing charging to start/continue or by improperly balancing voltage levels based upon incorrect measurement values, the improper balancing creating the very overcharge or undercharge event to be protected against.

BMS 110 further includes an exceptional charge event detector 130 that monitors battery elements 105 during operation of ESS 100. One or more measureable parameters of battery elements are monitored and compared against a reference to determine whether an exceptional charge event is occurring, or has occurred. As discussed in more detail below, the reference may be determined from a statistical characterization of the collection of battery elements over time, with a "sufficient" deviation of any measured value from the reference an indication of a possible exceptional charge event, or a real-time characterization of relevant parameters from ESS 100.

Figure 2:
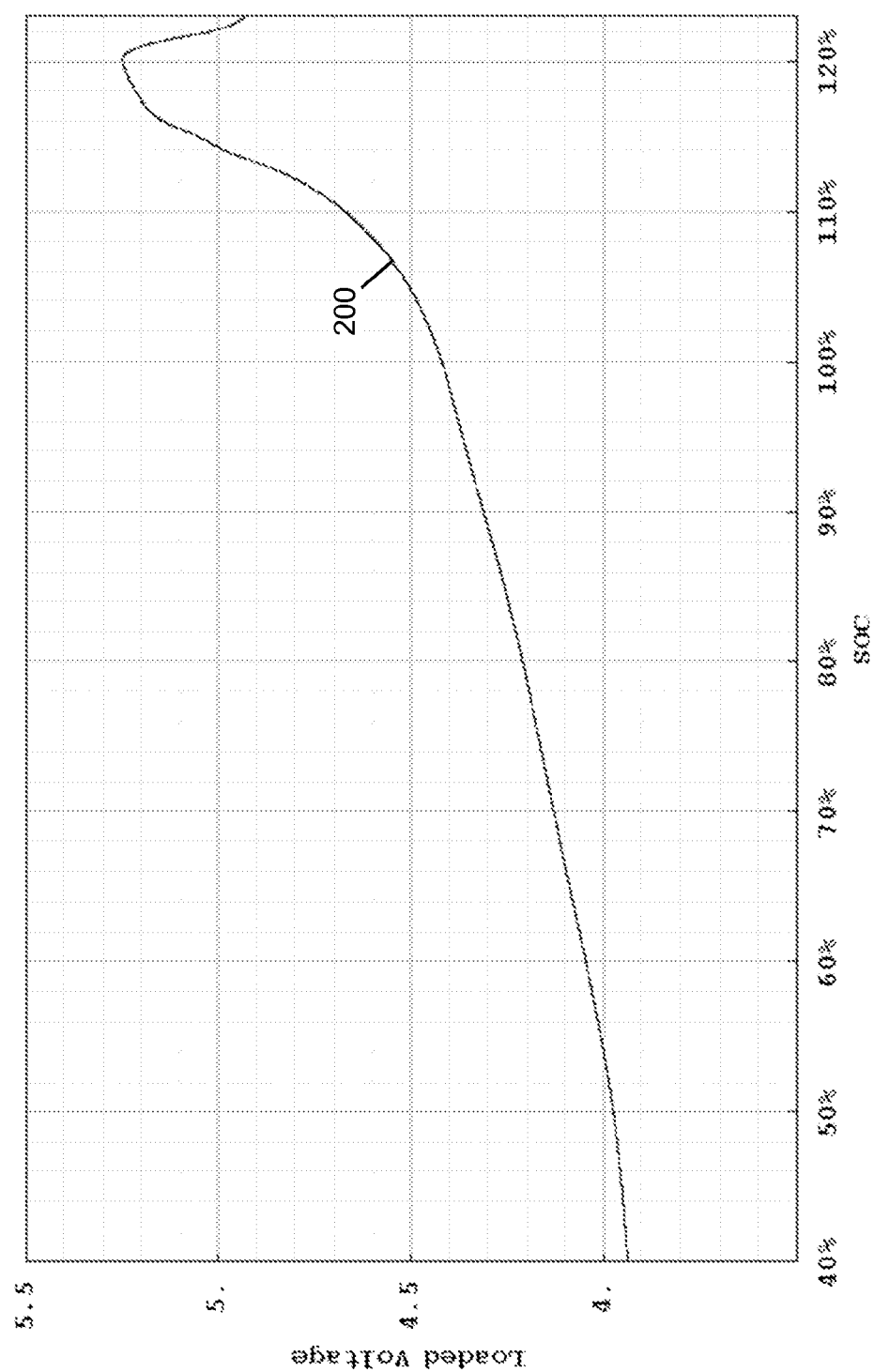
FIG. 2 illustrates a chart of loaded voltage versus State-of-Charge curve for a single representative series element.

FIG. 2 illustrates a chart of loaded voltage versus State of Charge (SOC) curve 200 for a single representative series element 105. Specifically in this case, battery element 105 includes eight parallel Lithium-ion cylindrical format cells being charged in a steady-state implementation. (Other implementations and arrangements will likely produce a different absolute curve; however the effect will be similar to that shown.) SOC curve 200 provides the voltage of the battery element as it is charged to different SOC levels. SOC curve 200 is effectively linear in the range of 10% to 100% SOC during "normal" charging.

Figure 3:
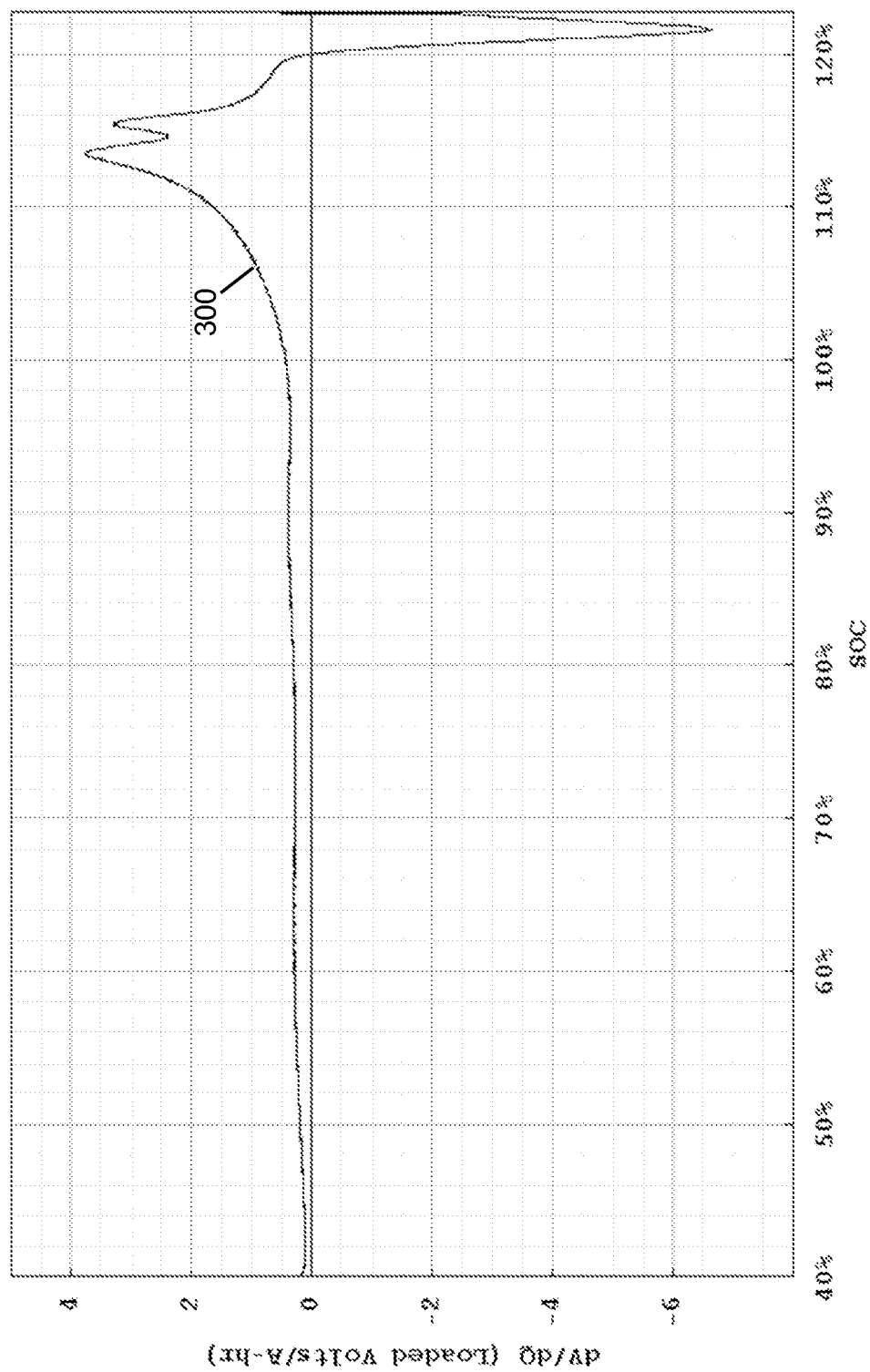
FIG. 3 illustrates a chart of a derivative of the curve of FIG. 2.

FIG. 3 illustrates a chart of a derivative curve 300 of SOC curve 200 of FIG. 2. Derivative curve 300 is a change of voltage per change of charge (dV/dQ) and confirms the linearity of SOC curve 200 in the normal charge range. Above the normal range (e.g., greater than 100% SOC) where overcharge begins, a slope of SOC curve 200 begins to become non-linear. Initially the slope increases and then it decreases, with the change significant. These changes in the slope are confirmed in derivative curve 300 at charge levels greater than 100%.

Not shown in FIG. 2 and FIG. 3 is that portion of SOC curve 200 (and corresponding portion of derivative curve 300) relating to overdischarge (charge levels below the "normal" range). Overdischarge in that portion of the charging range "below" the normal range will also experience marked changes in slope. The general concepts described herein with respect to overcharge may be applied to the overdischarge situation as well. The present discussion highlights the overcharge case in the representative discussion because it is generally associated with the more significant potential short-term risk.

The particular charge levels will vary among different cells, cell aggregations/arrangements, and cell chemistries used by ESS 100, therefore the specific shape of SOC curve 200 applicable to any particular ESS 100 varies. In these various implements of the present invention, there will be a corresponding normal range for an SOC curve where the operation is considered linear and end zones that are above and below the normal range where overcharge and overdischarge, respectively, occur resulting in the SOC curve becoming non-linear. Measuring and detecting these linear and non-linear regions by BMS 110 is used to detect exceptional charge events. Once detected, BMS 110 may assert control and/or status signals to other components for a desired response.

Figure 4:
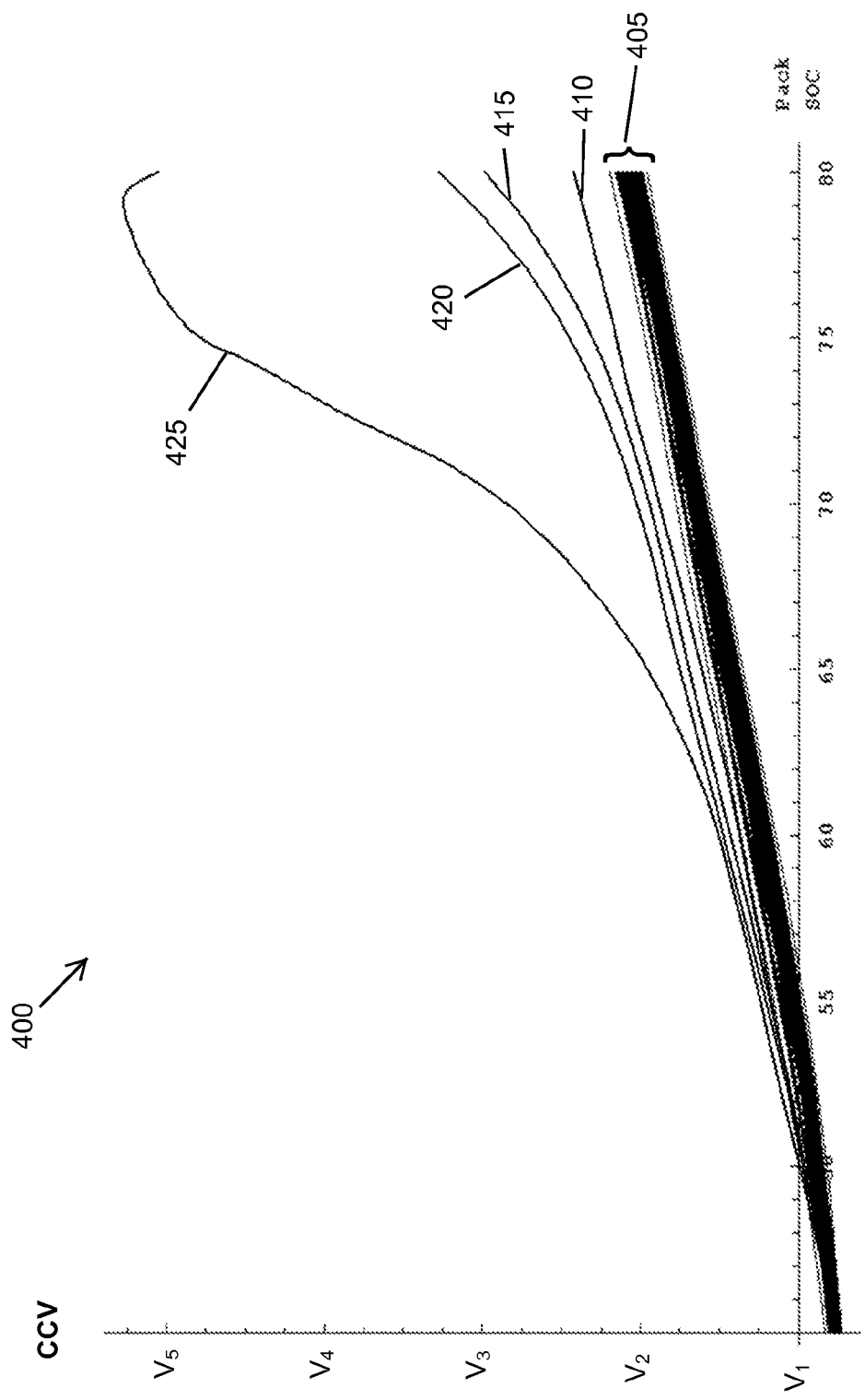
FIG. 4 illustrates a graph of a set of series element voltages during charging.

FIG. 4 illustrates a chart of a set 400 of series element voltages during steady state charging. A subset of voltages are identified by a set 405 of traces that include a large number (e.g., ~100) series elements voltages. Battery elements 105$i$ of set 405 represent the bulk of battery elements that charge normally and are balanced within a predetermined threshold (e.g., +/−1%) prior to charging. The traces of set 405 are linear in the normal range and indicate charging within design specification.

Set 400 includes additional traces that could represent problematic exceptional charge events. These additional traces include a first trace 410 having a small (e.g., a 0.2 V offset or less) and a second trace 415 having a small (e.g., 5% gain error or less) that are representative of a 20% imbalance. Set 400 also includes traces with a larger imbalance, for example, a 30% imbalance. A third trace 420 includes a 0.3 V offset and a fourth trace 425 includes a 7.5% gain error. For the 20% imbalance, overcharge starts at about 80% SOC while for the 30% imbalance, overcharge starts at about 70% SOC. As noted herein, both the offset and the gain errors are broadly described as instances of measurement errors. Any measurement error producing a significant deviation of a CCV-SOC curve relative to an expected curve may be encompassed by embodiments of the present invention.

Detection

BMS 110 registers a possible series element overcharge event in response to a sustained increase or decrease in voltage of one or more series elements beyond some predetermined reference (the value of the reference itself may vary). For steady state for example, the reference may be a statistically established average. For transient operation, the reference may be a value obtained from a lookup table. This predetermined reference may be dependent upon a total number of series elements and/or other factors. For example this threshold may be a deviation that is more than 1.5×, 2×, or 2.5× relative to a predetermined parameter and exceeding this threshold results in the detection of the exceptional charge event. The parameter may be a statistical assessment (e.g. a standard deviation), or some measurement or calculation or the like (e.g., an average) that is derived from a distribution (preferably a real-time distribution) of series element voltages during charge. For FIG. 4, overcharge is indicated by a variation in a measured value that exceeds 1% of the values of set 405.

For some embodiments, there are variations in charging behavior that are responsive to physical conditions of ESS 100 (e.g., temperature, cycle life, SOC, and the like that in turn are dependent on specific cell type and chemistry). These variations can be predictable and determined in advance to be known quite accurately. In such situations, BMS 110 may use a look up table for comparison of individual voltages in place of the evaluation of the instantaneous distribution of series element voltages and subsequent comparison.

The measurements, tests, and comparisons of battery element voltages against the SOC curve (e.g., FIG. 2) is also pertinent to a measurement, test, and comparison of the derivation curve (e.g., FIG. 3). For example, BMS 110 compares first derivatives of the CCV versus SOC curves for battery elements 105 of ESS 100 against a predetermined reference (the predetermined value). This predetermined reference may be dependent upon a total number of series elements and/or other factors. For example this threshold may be a deviation that is more than 1.5×, 2×, or 2.5× relative to a predetermined parameter and exceeding this threshold results in the detection of the exceptional charge event. The parameter may be a statistical assessment (e.g. a standard deviation), or some measurement or calculation or the like) that is derived from a distribution (preferably a real-time distribution) of series element voltages during charge. For FIG. 4, overcharge is indicated by a variation in a measured value that exceeds 1% of the values of set 405.

Some embodiments include BMS 110 using variations of other characterizations of ESS 100 as a function of time. The characterizations may also include elapsed time (assuming a constant current charging rate), integrated charge, integrated charging energy, or estimated open-circuit voltage (OCV) that may be used in place of SOC as a dependent variable. In other embodiments, a measure of time, SOC, or integrated charge, or integrated energy, or estimated OCV versus series element voltage could be used by BMS 110 to detect exceptional charge events.

While the description above includes embodiments with BMS 110 configured for data acquisition of individual voltages of all the battery elements, not all embodiments need be configured in this way. Some embodiments provide a composite assessment in which battery elements 105 are combined into measurement units. Such a composite assessment may be in addition to, or in lieu of, individual measurement. For example, a pair of battery elements 105 may be collectively measured and that collective measurement compared against a predetermined reference. Other embodiments may use triplets instead of pairs, or other number of battery elements measured together. Practically any collective assessment may be used provided that a precision of the measurement enables variations due to an exceptional charge event of any individual series battery element. Such collective measurements can be compared with the sum of the measurements of the included individual elements, with a discrepancy indicating a possible exceptional charge event. Possible advantages of such collections include the situation that embodiments employing such collective assessment may have cost-advantages when the collective measurement simplifies and reduces measurement and data acquisition components of BMS 110.

As noted elsewhere, the SOC curve includes a sharp drop in voltage at the low SOC end of charging which BMS 110 is able to use when identifying possible overdischarge of a series element during discharge cycles by similar comparisons previously described. Though overdischarge is not nearly as severe an event as overcharge, detection of a potential overdischarge can be used to trigger an appropriate response that may prevent possible overcharge on subsequent charging cycles.

The disclosed embodiments include several different ways of detecting an exceptional charge event associated with one or more battery elements. Embodiments of the present invention provide ESS 100 and/or BMS 110 with a range of possible responses to a detected exceptional charge event. Overcharge of one or more individual battery elements 105 during charging is generally viewed as the more potentially serious and urgent situation.

As noted herein, the detection modalities are categorized based upon a type of use of ESS 100. When the use, during charging or discharging, provides for rapid changes in energy transfer to or from ESS 100, then the principles described in the context of transient detection are employed. When the use, during charging or discharging, provides for steady energy transfer that is provided at a rate fairly constant over several measurement cycles, then the principles described in the context of steady state detection are employed.

A primary difference is the type of data that is collected within measurement and analysis cycles. In the transient case, energy flows relative to ESS 100 change fairly rapidly. It may take time to gather enough information for statistical evaluation of means, averages, deviations, and the like and in a transient operation, those values are not as helpful to quickly and unambiguously detect an exceptional charge event. As a point of generality, the transient case is often associated with potentially larger peak energy transfer rates. Even when it may be possible to begin to gather data over enough time, there can be increased risk to waiting and it is desirable to employ other faster-responding detection modalities.

In steady state operation (e.g., charging an EV, or withdrawing current from the stationary storage), the current to or from ESS 100 is regular and more predictable. When in steady state operation, the current flow relative to ESS 100 will for the most part be constant, or at least slowly changing, and a relatively long time history can be taken and used in the controller. This includes collecting enough data from all the battery elements and developing the requisite reference(s), and then performing the tests of battery element values versus the reference(s).

In transient operation (e.g., withdrawing charge from the EV ESS or charging the stationary storage device using wind turbines or solar panels and the like), the current flow relative to ESS 100 will be irregular and unpredictable, and is determined by the operational pattern (driving, wind, and sun).

In steady state operation, statistical information can be determined from large enough collections of data to be statistically significant. During operational modes which experience predominately transient patterns, there are periods in which operation is steady enough to include steady state tests. These steady state tests (standard deviation of absolute voltage measurement or derivative over a period of time) can be made when current is relatively stable (cruising on the highway for example), but transient detection takes advantage of different characteristics of the cell during transient events. In particular, during a transient discharge event such as gunning the EV for several seconds, if a severe imbalance is present that is masked by gain/offset errors, the imbalanced battery cell will deviate from the rest significantly due to much different cell impedance. This deviation can be detected in a few seconds, versus the slower deviation that would occur during charging over several minutes. A lookup table of impedance versus SOC can be used to bound the degree of deviation that triggers a response (changes in temperature throughout the pack can also cause changes in cell impedance which would cause deviation in a transient current event like flooring the car, so the controller monitors for an extreme deviation).

In this transient operation, a lookup table stores impedance values for a range of SOC values for individual battery elements (or aggregations of battery elements). During transient operation, impedance values are established for each loaded battery element. The lookup table is accessed with the loaded impedance value and produces the corresponding SOC value. If the SOC falls outside a specified range (either representing an overcharged or overdischarged battery element) then the controller has detected the exceptional charge event (e.g., overcharge or overdischarge). Because changes of impedance versus SOC are not linear, and can vary by temperature, impedance values are not compared or used directly in the preferred embodiments. The impedance is converted to a corresponding SOC and then the SOC is evaluated for an exceptional charge event.

Some implementations may rely on some other charge-related parameter besides, or in addition to, impedance. When the relationship to the measured parameter and the charge-related parameter can be calculated in real-time without resources that are too expensive for the particular application, the controller may determine the numbers without reference to a lookup table. What is too expensive is dependent upon the implementation, with those resources including one or more of calculation time, parts cost, parts weight, parts reliability, and the like.

Responses

In the disclosed embodiments, responses are based upon a type of exceptional charge event that was detected. One set of responses relate to overcharge events and another set of responses relate to overdischarge events.

Overcharge

Responses to a detection of a possible overcharge event (or response to a determination of a sufficient likelihood of such an event) of a battery element 105 include one or more of the following.

A simple first type of response is for BMS 110 to assert a signal that stops any charging of ESS 100. In this way any risk of an adverse effect of overcharge may be greatly reduced.

A second type of response includes assertion by BMS 110 of a diagnostic trouble code (DTC) or malfunction indicator light (MIL). A management system coupled to ESS 100 is able to detect and respond to the DTC or MIL and take further corrective action, including suspending any charging.

A third type of response locks out future charging until ESS 100 has been serviced. In some embodiments charging is not completely locked, but rather is limited to reduce overcharge risks while enabling some function. For an EV, the limited function is sufficient to enable the EV to be driven to a service center. Two or three of these first types of response can be used together to provide a simple response modality to detected overcharge events.

A fourth type of response includes use of VMBS 125 to bleed overcharged battery elements, or those with a significant enough chance to be overcharged, to a reduced charge level. When event detector 130 is triggered, VMBS 125 is by definition in a compromised operational mode and it therefore cannot be used to properly manage and regulate bleeding of the overcharged battery element(s). BMS 110 triggers a bleed circuit, which could be part of VMBS 125, to bleed a desired amount of charge capacity from the subject battery elements. The amount of reduction or bleed can be implementation specific to reduce risks of overcharge to a desired level. Some embodiments bleed about 50% capacity. BMS 110 uses the bleed circuit (e.g., a selectively engageable circuit having a known impedance) along with an assumed (non-measured) SOC (e.g., assume 110% SOC irrespective of measured value) to determine an amount of time to bleed energy from the subject battery element to reach the desired reduced capacity. In some cases BMS 110 may manage the bleed and set the desired level by monitoring bleed current directly.

A fifth type of response includes adjustment of SOC or voltage targets based on true SOC at the time of detection. True SOC may be determined by BMS 110 in multiple different ways including integrated charge, total voltage of ESS 100, and the like. The adjustments of SOC or voltage targets could be performed incrementally as information is collected with each charge cycle. In this response, the SOC target for charging is reduced by some value when the exceptional charge event is detected. The reduction may be some set amount or be responsive to the degree of mismatch between corresponding attributes (e.g., measured voltage) an exceptional battery element (battery element 105 having the exceptional charge event) and battery elements within set 405.

A sixth type of response, similar to the fifth type, reduces the max SOC or target voltage for all battery elements 105. BMS 110 causes ESS 100 to run at a reduced max SOC or voltage until ESS 100 is serviced.

A seventh type of response includes use of the BMS 110 measurement and data acquisition components to log the various events. When the detected overcharge event is evaluated and poses no significant risk to ESS 100 or operators, then logging is an appropriate response as it does not impair operation or use which could, in some situations, pose more risk or inconvenience than the overcharge event. The logging event includes determination and recording of one or more of the following: temperature, SOC of all bricks, voltage measurements of all bricks, dV/dQ of all bricks at the time of the event, and charge/discharge rate. The log may be stored in BMS 110 or it may be sent to a data center for processing. In some embodiments, BMS 110 includes a transmitter (e.g., a wireless device that uses an available network connection (such as at home or other location frequented by a mobile implementation of ESS 100)) that sends the log information to a datacenter for monitoring and processing.

An eighth type of response includes adjustment of element parameters (e.g., voltage gain and/or voltage offset factors) for affected battery elements 105. In this type of response to a detected exceptional charge event, each battery element 105 having an exceptional charging profile that tags the battery element as experiencing a possible exceptional charge event is flagged. BMS 110 adjusts those element parameters to reduce the variation between the exceptional charging profile and the charging profiles of the battery elements of set 405. Preferably the adjustments move the exceptional charging profile into set 405.

A ninth type of response addresses thermal control of ESS 100. As discussed herein, some of the embodiments are implemented to address potential risks of a potential thermal runaway for any battery element with an imbalance that could, responsive to charging, lead to overcharge and excess heating. This response relates to reducing the temperature of ESS 100 and/or its components to reduce overheating which can lead to the thermal runaway. ESS 100 typically includes some type of thermal control system (e.g., a cooling system that circulates a coolant through ESS 100 to extract heat and some type of heat exchanger to transfer heat from the coolant and the like). This response includes BMS 110 initiating increased cooling from the thermal control system. The thermal control system is either operated at increased cooling capacity or maximum depending upon what is needed or desired to sufficiently reduce any risk of thermal runaway. The increased cooling reduces any chance that the battery element experiencing an overcharge event has to self-heat to a point of thermal runaway.

In some embodiments, the thermal control system is engaged in the heightened cooling mode immediately upon detecting the overcharge event. As discussed above, it is also the case that the detected overcharge event could initiate another additional response as well. That additional response may correct or reduce the overcharge event, in which case the heightened cooling mode may be reduced or terminated. For example, after initiating the heightened cooling mode, the exceptional battery element may be bled by VMBS 125 so it is no longer overcharged and further chances of overcharging are reduced. Thereafter the thermal control system may be turned off (as is typical for charging).

In other implementations, a version of this ninth type of response includes adjustments to one or more thermal setpoints of the thermal control system. BMS 110 is able to reduce the thermal setpoints (which initiate actuation of the thermal control system) at a lower temperature to provide an extra margin of safety in response to a detected overcharge event.

A tenth type of response includes a backup response that addresses situations in which the parameter (e.g., voltage) measurement system becomes inoperative. This backup response may, in some implementations, take a more primary role in the event a voltage measurement facility becomes fully inoperative (e.g. a voltage sense wire becomes disconnected), even when there isn't an exceptional charge event detected. Many systems respond to an inoperative voltage measurement by immediately disallowing drive. Some embodiments of the present operate on voltage measurements of a pair of non-contiguous battery elements, where the missing voltage measurement is of a battery element between the pair of battery elements. This response allows for some protection from exceptional charge events (both overcharge and overdischarge), even though a parameter measurement is missing for the particular battery element. This is a special operational mode that is not designed for sustained drive. However, including such an optional response could allow a user to drive the car into service, rather than becoming immediately stranded and requiring towing in the event a voltage measurement went dead.

Overdischarge

In the event of a detected exceptional charge event that includes an overdischarge of one or more battery elements, BMS 110 provides one or more appropriate responses. The following seven responses are counterparts to some of the overcharge responses noted herein.

A first type of response to an overdischarge includes prevention of future charging of the vehicle until the vehicle is serviced. It is somewhat counter-intuitive to address overdischarge by controlling, limiting, or preventing charging but it has been observed that some problems which lead to overdischarge may lead to overcharge on subsequent charging cycles.

A second type of response includes adjusting charge SOC or voltage targets (possibly incrementally as information is collected with each charge cycle) based on true SOC at the time of detection. In this case, in contrast to overcharge responses, the charge SOC or voltage targets may be selectively increased.

A third type of response includes BMS 110 initiating ESS 100 to operate using increased minimum SOC or voltage targets.

A fourth type of response includes logging the event, which may include one or more of temperature, SOC of all bricks, voltage measurements of all bricks, dV/dQ of all bricks at the time of the event, and charge/discharge rate. As noted above, the log may be stored in an internal memory associated with ESS 100 or communicated to a data center. The internal memory does not have to physically be part of ESS 100 but may be included in another control or data acquisition system electrically communicated with ESS 100.

A fifth type of response includes adjustments to parameters (e.g., gain/offset factor) for the affected battery element. In some cases the adjustment may also affect other battery elements in addition to the targeted battery elements. That is, some parameter adjustments may affect several elements and BMS 110 may need to use a secondary adjustment modality to compensate for having adjusted non-targeted battery elements.

A sixth type of response includes a backup response that addresses situations in which the parameter (e.g., voltage) measurement system becomes inoperative. This backup response may, in some implementations, take a more primary role in the event a voltage measurement facility becomes fully inoperative (e.g. a voltage sense wire becomes disconnected), even when there isn't an exceptional charge event detected. Many systems respond to an inoperative voltage measurement by immediately disallowing drive. Some embodiments of the present operate on voltage measurements of a pair of non-contiguous battery elements, where the missing voltage measurement is of a battery element between the pair of battery elements. This response allows for some protection from exceptional charge events (both overcharge and overdischarge), even though a parameter measurement is missing for the particular battery element. This is a special operational mode that is not designed for sustained drive. However, including such an optional response could allow a user to drive the car into service, rather than becoming immediately stranded and requiring towing in the event a voltage measurement went dead.

A seventh type of response includes BMS 110 limiting a maximum current draw from ESS 100. This response artificially throttles back the power available to the EV which prevents rapid discharging and possible overheating during the exceptional charge event. This response isn't generally applicable to overcharge because the charging current would be set by the charging parameters and the currents are generally much lower than during discharge.

Figure 5:
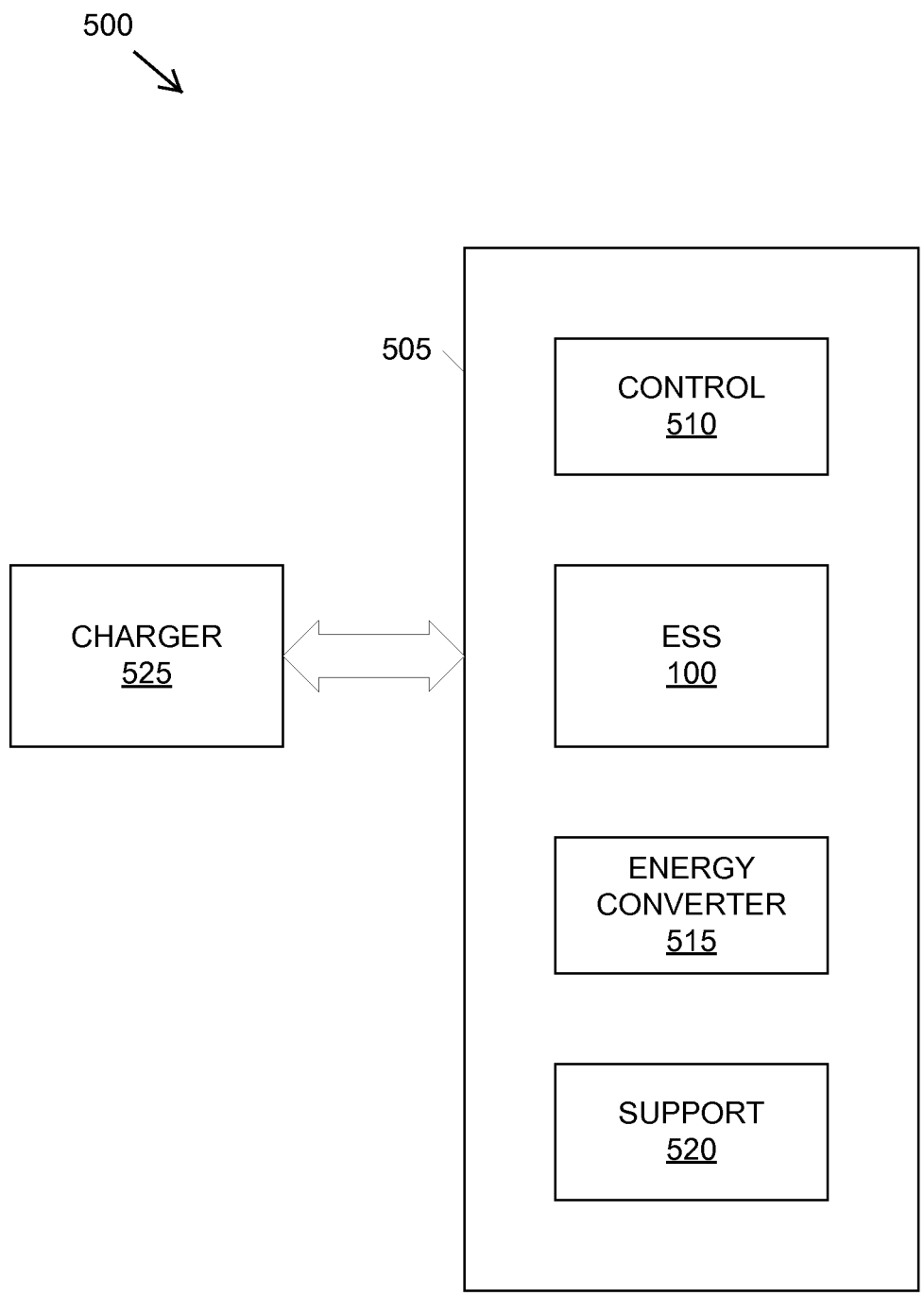
FIG. 5 illustrates a system including exceptional charge event detection and response.

FIG. 5 illustrates a system 500 implementing exceptional charge event detection and response. System 500 includes an energy environment 505 that encompasses ESS 100, a control system 510, an energy converter 515, and a support system. Energy environment 505 may be an electric vehicle or other context in which electrical energy is stored and converted. Control system 510 monitors state and status of the various components and includes I/O (input/output) features appropriate to the context, such as receiving input from a user regarding velocity. Control system 510 typically includes a stored program computing system that has memory and a processing unit configured to implement control mechanisms of the components of system 500. Control system 510 may be integrated wholly or partially with another component of system 500, such as with BMS 110 of ESS 100. In other cases, some or all of the functions of BMS 110 may be implemented by control system 510. Energy converter 515 represents one or more elements that use energy from ESS 100. These elements may include electric motors (e.g., an electric propulsion motor) and other devices that use energy in energy environment 505. Support 520 represents thermal control systems and other components of energy environment 505 that support its use and operation.

System 500 further includes a charger 525 that is typically a stationary energy charging station and provides a source of power (typically AC power) that is used to charge the battery elements of ESS 100. One or more components of energy environment 505 may implement any of the detection and response modalities describe herein.

Figure 6:
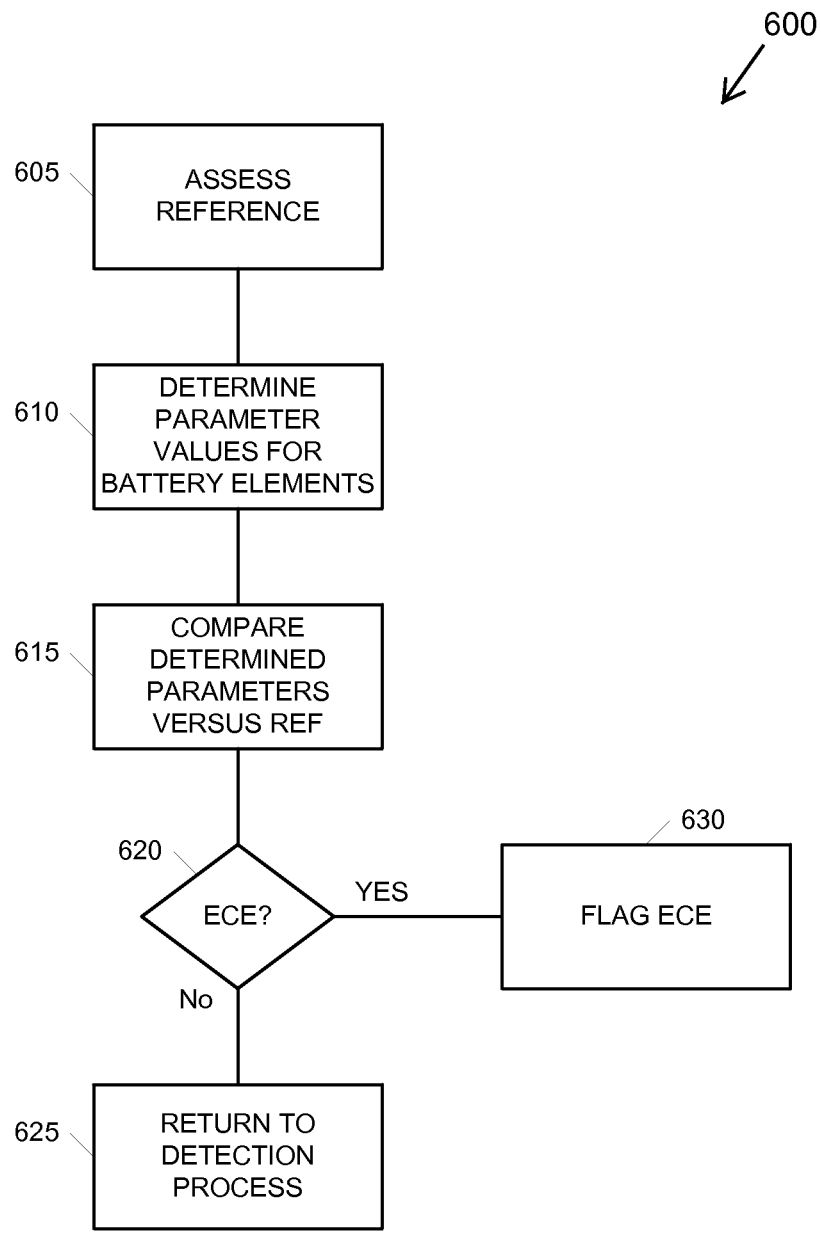
FIG. 6 illustrates a flowchart for a detection process.

FIG. 6 illustrates a flowchart for a detection process 600. Process 600 includes steps 605-630 to establish an existence, or likelihood of existence, of an exception charge event (ECE). Step 605 first assesses the reference. In a simple case, ESS 100 includes monitoring and data acquisition equipment (e.g., voltage and current sensors and logic devices for measurement and evaluation) of the reference that will be used. During charging, the ECE of most concern is the overcharge event, while overdischarge could be relevant during charging of ESS 100 as well as during operation of energy environment 505.

The reference of step 605 is preferably a statistical representation of samples of the collection of voltages of battery elements 105 of ESS 100. Other references may be employed, such as outputs of look-up tables or other data organization.

Next in process 600 after step 605, step 610 determines desired parameter values for individual battery elements 105. The discussion includes several ways to do this, including measuring individual voltage levels or measuring voltage levels of aggregations (e.g., pairs of battery elements 105).

Next step 615 performs a comparison of the determined individual voltage levels against the reference. In a preferred embodiment, a determination of a charge event as normal or exceptional is based upon an evaluation of parameter value performance, which in turn can be dependent upon transient or steady state operation. Specifically for steady state operation, upon the SOC curve and the derivation curve. In this sense, this type of detection implemented by the embodiments of the present invention are not instantaneous determinations as this process is responsive to trend of the parameter values of the battery elements, preferably as a function of state of charge, and most preferably as loaded battery element voltage as a function of SOC. Transient operation, as noted above, is more instantaneous and can provide quicker responses.

After, or during, the comparison of parameter values against the reference, process 600 at step 620 tests the results of the comparison against a threshold value. Depending upon how the test is implemented (e.g., whether exceeding a threshold is true or not exceeding the threshold is true), step 620 establishes whether a particular comparison represents, or has a sufficient likelihood to represent, an exceptional charge event. Further differentiation is based upon whether system 500 is charging at the time of the test. Exceptional charge events during charging typically represent overcharge events and exceptional charge events at other times typically represent overdischarge events.

When process 600 does not determine that an ECE exists at the test of step 620, process 600 continues with the detection process. What that means is dependent upon specifics of how steps 605-620 were implemented. For an interrupt-driven test, step 625 returns to the operation it was performing when interrupted. In some cases step 615 and step 620 are combined, so step 626 returns to step 615 for another comparison of another parameter against the reference. In some cases process 600 updates the reference so step 625 returns to step 605 to determine whether the reference needs to be updated. Step 625 can simply return to step 610 to continue to monitor parameters of battery elements 105.

When the test at step 620 is true, process 600 uses the comparison to identify and flag the exceptional battery element as having an exceptional charge event (which may be further identified as an overcharge or an overdischarge charge event based upon use/implementation and a status of charging from charger 525. Most implementations further include one or more responses to any detected ECE at step 630. The response may be dependent upon the type of ECE as well. Embodiments of the present invention described herein include representative types of responses.

Figure 7:
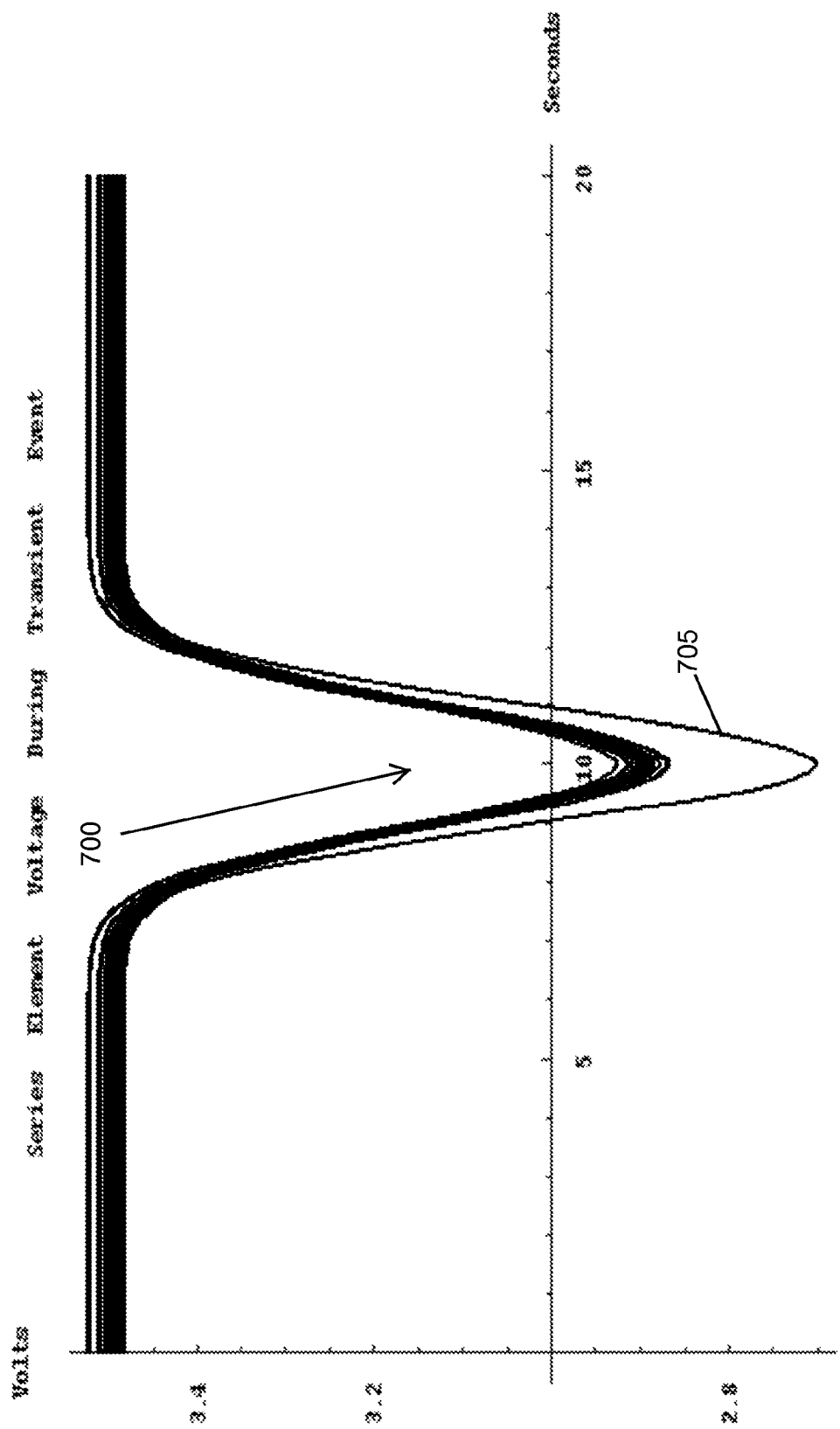
FIG. 7 illustrates a graph of a transient discharge event for a set of series battery elements.
Figure 8:
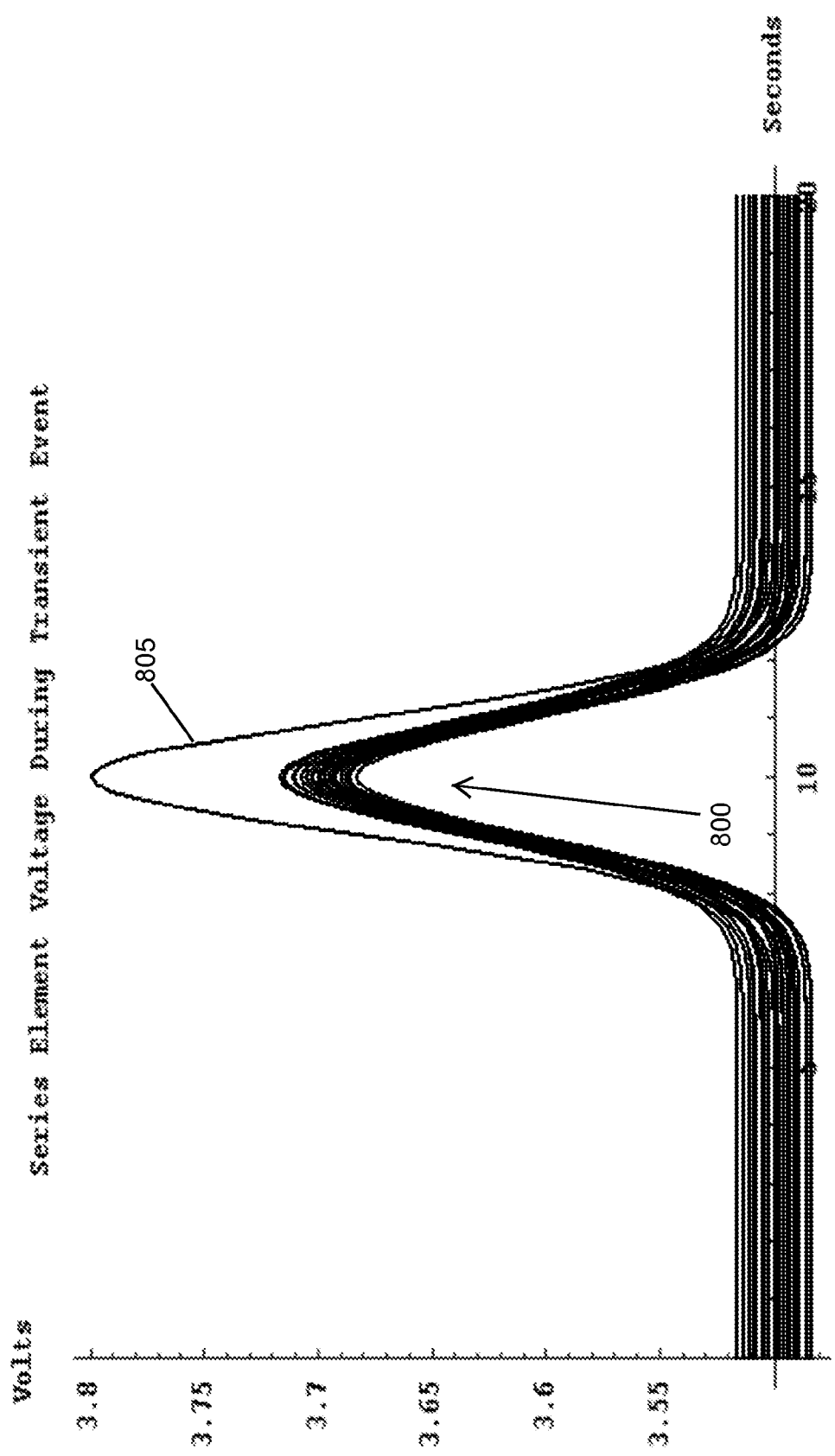
FIG. 8 illustrates a graph of a transient charge event for a set of series battery elements.

FIG. 7 illustrates a graph of a transient discharge event 700 for a set of series battery elements; and FIG. 8 illustrates a graph of a transient charge event 800 for a set of series battery elements. Event 700 and event 800 make use of impedance for transient detection of exceptional charge events. In each graph, the set of curves that are generally matched represent series elements that are not exceptionally charged. A series element 705 in the transient discharge event 700 and a series element 805 in the transient charge event represent exceptionally charged elements. Outside of the transient event, each exceptional charge element appears like a non-exceptionally charged element because of measurement offset/gain error during no/low current draw. During a high current draw, such as event 700, the voltage of all series elements drop as current is pulled from the elements (discharge), but the exceptionally charged element drops significantly more than the rest (FIG. 7). During a high current charge, such as event 800, the voltage of all series elements rise as current is transferred to the elements (charge), but the exceptionally charged element rises significantly more than the rest (FIG. 8). The detection methods outlined would detect these exceptional charge events. The impedance approach is useful because the very high current pulse magnifies the effects of the impedance difference. During a steady state event, currents are typically much (~10×) lower, so the impedance approach wouldn't be as useful as the steady observation of voltage drift with time.

The system and methods above has been described in general terms as an aid to understanding details of preferred embodiments of the present invention. In the description herein, numerous specific details are provided, such as examples of components and/or methods, to provide a thorough understanding of embodiments of the present invention. Some features and benefits of the present invention are realized in such modes and are not required in every case. One skilled in the relevant art will recognize, however, that an embodiment of the invention can be practiced without one or more of the specific details, or with other apparatus, systems, assemblies, methods, components, materials, parts, and/or the like. In other instances, well-known structures, materials, or operations are not specifically shown or described in detail to avoid obscuring aspects of embodiments of the present invention.

Reference throughout this specification to "one embodiment", "an embodiment", or "a specific embodiment" means that a particular feature, structure, or characteristic described in connection with the embodiment is included in at least one embodiment of the present invention and not necessarily in all embodiments. Thus, respective appearances of the phrases "in one embodiment", "in an embodiment", or "in a specific embodiment" in various places throughout this specification are not necessarily referring to the same embodiment. Furthermore, the particular features, structures, or characteristics of any specific embodiment of the present invention may be combined in any suitable manner with one or more other embodiments. It is to be understood that other variations and modifications of the embodiments of the present invention described and illustrated herein are possible in light of the teachings herein and are to be considered as part of the spirit and scope of the present invention.

It will also be appreciated that one or more of the elements depicted in the drawings/figures can also be implemented in a more separated or integrated manner, or even removed or rendered as inoperable in certain cases, as is useful in accordance with a particular application.

Additionally, any signal arrows in the drawings/Figures should be considered only as exemplary, and not limiting, unless otherwise specifically noted. Furthermore, the term "or" as used herein is generally intended to mean "and/or" unless otherwise indicated. Combinations of components or steps will also be considered as being noted, where terminology is foreseen as rendering the ability to separate or combine is unclear.

As used in the description herein and throughout the claims that follow, "a", "an", and "the" includes plural references unless the context clearly dictates otherwise. Also, as used in the description herein and throughout the claims that follow, the meaning of "in" includes "in" and "on" unless the context clearly dictates otherwise.

The foregoing description of illustrated embodiments of the present invention, including what is described in the Abstract, is not intended to be exhaustive or to limit the invention to the precise forms disclosed herein. While specific embodiments of, and examples for, the invention are described herein for illustrative purposes only, various equivalent modifications are possible within the spirit and scope of the present invention, as those skilled in the relevant art will recognize and appreciate. As indicated, these modifications may be made to the present invention in light of the foregoing description of illustrated embodiments of the present invention and are to be included within the spirit and scope of the present invention.

Thus, while the present invention has been described herein with reference to particular embodiments thereof, a latitude of modification, various changes and substitutions are intended in the foregoing disclosures, and it will be appreciated that in some instances some features of embodiments of the invention will be employed without a corresponding use of other features without departing from the scope and spirit of the invention as set forth. Therefore, many modifications may be made to adapt a particular situation or material to the essential scope and spirit of the present invention. It is intended that the invention not be limited to the particular terms used in following claims and/or to the particular embodiment disclosed as the best mode contemplated for carrying out this invention, but that the invention will include any and all embodiments and equivalents falling within the scope of the appended claims. Thus, the scope of the invention is to be determined solely by the appended claims.

What is claimed as new and desired to be protected by Letters Patent of the United States is:

1. An exceptional charge event detector for an energy storage system having a plurality of series-connected battery elements, comprising:
   a data acquisition system, coupled to the plurality of series-connected battery elements and determining, for each battery element of the plurality of series-connected battery elements, an associated charge dependent parameter during an operational period of the energy storage system;

a controller, coupled to said data acquisition system, establishing a characterization for each battery element of the plurality of series-connected battery elements from said associated charge dependent parameters;

the controller determining an exceptional characteristic pattern for said operational period and a normal characteristic pattern for said operational period for each battery element, the normal characteristic pattern based upon statistical monitoring of the each battery element and the exceptional characteristic pattern based upon and deviating from the normal characteristic pattern; and wherein said controller detects an exceptional charge event for a selected one battery element whenever said characterization for said selected one battery element correlates to an associated exceptional characteristic pattern.

2. The exceptional charge event detector of claim 1 wherein said operational period includes a transient charging event during a charging of the energy storage system.

3. The exceptional charge event detector of claim 1 wherein said operational period includes a transient discharging event during a discharging of the energy storage system.

4. The exceptional charge event detector of claim 1 wherein said associated charge dependent parameter includes a cell impedance of said associated battery element.

5. The exceptional charge event detector of claim 2 wherein said associated charge dependent parameter includes a cell impedance of said associated battery element and wherein said exceptional characteristic pattern includes said cell impedance having a value representing an overcharge condition.

6. The exceptional charge event detector of claim 5 wherein said overcharge condition is represented when said cell impedance is less than a normal cell impedance indicating a normal charge condition by a predetermined margin.

7. The exceptional charge event detector of claim 5 further comprising a lookup table coupled to said data acquisition system, said lookup table including a plurality of cell impedance values and corresponding associated SOC values, said lookup table providing, for each particular battery element of the plurality of series-connected battery elements, a particular one associated SOC value responsive to said cell impedance of said particular battery element.

8. The exceptional charge event detector of claim 3 wherein said associated charge dependent parameter includes a cell impedance of said associated battery element and wherein said exceptional characteristic pattern includes said cell impedance having a value representing an overdischarge condition.

9. The exceptional charge event detector of claim 8 wherein said overdischarge condition is represented when said cell impedance is greater than a normal cell impedance indicating a normal charge condition by a predetermined margin.

10. The exceptional charge event detector of claim 8 further comprising a lookup table coupled to said data acquisition system, said lookup table including a plurality of cell impedance values and corresponding associated SOC values, said lookup table providing, for each particular battery element of the plurality of series-connected battery elements, a particular one associated SOC value responsive to said cell impedance of said particular battery element.

11. The exceptional charge event detector of claim 1 wherein said data acquisition system includes a voltage measurement and balancing system establishing and reducing a voltage mismatch between voltage levels of the plurality of battery elements.

12. A rechargeable energy storage system having a plurality of series-connected lithium-ion battery elements, comprising:

a voltage measurement and balancing system detecting and reducing voltage imbalances between voltage levels of the plurality of battery elements of the energy storage system wherein said voltage measurement and balancing system uses a first detection modality to determine an existence of a voltage imbalance; and an exceptional charge event detector monitoring the plurality of battery elements for an exceptional charge event using a second detection modality different from said first detection modality, the exceptional charge event detector configured to:

establish a characterization for at least one battery element that includes a normal characteristic pattern and an exceptional characteristic pattern, the normal characteristic pattern based upon statistical monitoring of the at least one battery element during an operational period and the exceptional characteristic pattern based upon and deviating from the normal characteristic pattern; and detect the exceptional charge event for the at least one battery element when a characterization of the at least one battery element correlates positively to the exceptional characteristic pattern.

13. The rechargeable energy storage system of claim 12 wherein said exceptional charge event detector further comprises:

a data acquisition system, coupled to the plurality of series-connected battery elements and determining, for each battery element of the plurality of series-connected battery elements, an associated charge dependent parameter during an operational period of the energy storage system; and a controller, coupled to said data acquisition system, establishing a characterization for each battery element of the plurality of series-connected battery elements from said associated charge dependent parameters.

14. The rechargeable energy storage system of claim 13 wherein said operational period includes a transient charging event during a charging of the energy storage system.

15. The rechargeable energy storage system of claim 13 wherein said operational period includes a transient discharging event during a discharging of the energy storage system.

16. The rechargeable energy storage system of claim 13 wherein said associated charge dependent parameter includes a cell impedance of said associated battery element.

17. The rechargeable energy storage system of claim 14 wherein said associated charge dependent parameter includes a cell impedance of said associated battery element and wherein said exceptional characteristic pattern includes said cell impedance having a value representing an overcharge condition.

18. The rechargeable energy storage system of claim 17 wherein said overcharge condition is represented when said cell impedance is less than a normal cell impedance indicating a normal charge condition by a predetermined margin.

19. The rechargeable energy storage system of claim 17 further comprising a lookup table coupled to said data acquisition system, said lookup table including a plurality of cell impedance values and corresponding associated SOC values, said lookup table providing, for each particular battery element of the plurality of series-connected battery elements, a particular one associated SOC value responsive to said cell impedance of said particular battery element.

20. The rechargeable energy storage system of claim 15 wherein said associated charge dependent parameter includes a cell impedance of said associated battery element and wherein said exceptional characteristic pattern includes said cell impedance having a value representing an overdischarge condition.

21. The rechargeable energy storage system of claim 20 wherein said overdischarge condition is represented when said cell impedance is greater than a normal cell impedance indicating a normal charge condition by a predetermined margin.

22. The rechargeable energy storage system of claim 20 further comprising a lookup table coupled to said data acquisition system, said lookup table including a plurality of cell impedance values and corresponding associated SOC values, said lookup table providing, for each particular battery element of the plurality of series-connected battery elements, a particular one associated SOC value responsive to said cell impedance of said particular battery element.

23. A computer-implemented method for detecting an exceptional charge event for an energy storage system having a plurality of series-connected battery elements, comprising:
   a) determining, for each battery element of the plurality of series-connected battery elements, an associated charge dependent parameter during an operational period of the energy storage system;
   b) establishing a characterization for each battery element of the plurality of series-connected battery elements from said associated charge dependent parameters;
   c) establishing an exceptional characteristic pattern for said operational period and a normal characteristic pattern for said operational period for each battery element, the normal characteristic pattern based upon statistical monitoring of the each battery element of the plurality of series-connected battery elements and the exceptional characteristic pattern based upon and deviating from the normal characteristic pattern; and
   d) detecting an exceptional charge event for a selected one battery element whenever a characterization for said selected one battery element correlates positively to an associated exceptional characteristic pattern.

* * * * *